United States Patent [19]

Hartzell

[11] 4,224,100
[45] Sep. 23, 1980

[54] METHOD AND APPARATUS FOR MAKING CRYSTALS

[75] Inventor: Robert A. Hartzell, Morris Plains, N.J.

[73] Assignee: Litton Systems, Inc., Morris Plains, N.J.

[21] Appl. No.: 916,422

[22] Filed: Jun. 16, 1978

[51] Int. Cl.² ............................................. B01J 12/10
[52] U.S. Cl. ...................... 156/617 M; 156/DIG. 83; 156/DIG. 95; 422/245
[58] Field of Search .......... 156/617 R, 617 H, 617 M, 156/617 SP, 617 V, 621, 624, DIG. 83, DIG. 95, 620; 422/248, 245, 250; 23/305 R

[56] References Cited

U.S. PATENT DOCUMENTS

| | | | |
|---|---|---|---|
| 2,872,299 | 2/1959 | Celmer et al. | 156/617 R X |
| 3,051,555 | 8/1962 | Rummel | 156/624 X |
| 3,067,139 | 12/1962 | Goorissen | 422/248 X |
| 3,188,373 | 6/1965 | Brunet et al. | 422/248 X |
| 3,514,265 | 5/1970 | Pastore | 422/248 X |
| 3,582,528 | 6/1971 | Seale et al. | 156/617 SP X |
| 3,759,670 | 9/1973 | Rummel | 156/DIG. 83 |
| 4,049,384 | 9/1977 | Wenckus et al. | 156/617 SP X |

FOREIGN PATENT DOCUMENTS

| | | | |
|---|---|---|---|
| 2501799 | 7/1976 | Fed. Rep. of Germany | 156/DIG. 95 |
| 2543752 | 4/1977 | Fed. Rep. of Germany | 156/DIG. 83 |
| 42-4766 | 2/1967 | Japan | 156/617 SP |

*Primary Examiner*—Joseph Scovronek
*Attorney, Agent, or Firm*—Norman Friedman; Michael H. Wallach; Robert F. Rotella

[57] ABSTRACT

An apparatus and method for making single crystals of a high melting point substance by a crucibleless skull process are provided wherein the apparatus operates with less power consumption than comparable prior art systems. The apparatus utilizes a self-sealing and self-venting charge comprising a mass of the substance with a preformed vent therein, the mass being held and retained by a side wall made of a felt of the substance. The charge is retained by an encircling plurality of rods comprising a nonsusceptible material. The charge is heated by RF induction from the center of the charge to form a melt which extends outward. The melt is extended longitudinally by translating the charge in the RF field.

10 Claims, 3 Drawing Figures

METHOD AND APPARATUS FOR MAKING CRYSTALS

BACKGROUND OF THE INVENTION

1. Field of the Invention

The invention is related to an improved skull processing method and apparatus for making crystals of high melting point substances such as zirconium dioxide or the like.

2. Description of the Prior Art

The skull melting process was developed to provide a means for heating refractory oxides to higher temperatures of up to 3000° C. in air.

The skull process involves direct high frequency induction heating of a refractory material, for example. The material is contained in a hollow, water cooled crucible-like container. The container is generally made of copper, water is pumped through the container to cool the container and thereby cool the interface between the container and the material being heated therein.

A stable melt is formed in the center of the material and retained in a sintered shell (or skull) of an identical composition formed at the interface between the material and the container when the material is heated. The skull eliminates the problems of a reaction with the container or contamination of melt by the container. Reaction with the container is limited by the interface of the skull between the melt and the inside wall of the container. The melt is solidified by slowly decreasing the temperature of the melt to room temperature. The material comprising the melt nucleates and grows into single crystals during this cooling process. Skull melting as described is a known process.

In a modification of the skull process, a powdered refractory oxide charge, for example, of zirconium dioxide which melts at a temperature of 2690° C. is placed in a finger-like metal water-cooled container. Melting is initiated by inductively heating the oxide particles. As the temperature of the oxide is increased, the oxide charge becomes electrically conductive and the radio frequency magnetic field (operating in the range 2.5 to 5 megahertz) couples directly to the contained melt. Even though the metal container is separated into fingers with spaces in between them, RF coupling to the melt is not very efficient for heating the melt because of the energy pumped away by water cooling. A significant amount of heat is absorbed by water cooling, which increases power consumption.

Various theoretical analyses of the skull melting process have indicated that for industrial applications, melt size and cost of power consumption are important considerations. Precise control of the melt temperature is unnecessary.

A prior art structure developed by Varian Inc., and described in their *Bulletin SMS-A*1) entitled "Varian Intermat Skull Melting System (Model A-1)" consists of a crucible-like structure of concentric water-cooled copper tubes. Sufficient cooling water is pumped from the copper base through each individual tube to maintain a cool solid sintered skull. The crucible-like assembly comprises two halves with each half being electrically isolated from the other to maximize coupling efficiency to the melt.

Water-cooled equipment has serious drawbacks that particularly affect the associated method of operation. Sometimes, the crucible-like container will leak water. If a crack develops on the interior portion of the crucible, the resulting water leak through the crack to the skull can result in an explosion. Tremendous amounts of power are necessary to maintain the melt temperature and at the same time enough water must be pumped through the crucible to remove sufficient heat from the skull to keep it solid. This makes water cooling inherently an extremely expensive step in the process because of the high cost of energy.

Frequently a skin forms over the top of the melt. This must be punctured manually to vent pressures from heated gases above the melt. This is a serious drawback and a potentially dangerous step.

SUMMARY OF THE INVENTION

The novel charge mixture consists of a metallic oxide in its highest valence state and a metal common to the metallic oxide and it is self-retaining. The metal should have a substantially higher RF susceptibility with respect to the metallic oxide. An example of such a metallic oxide is zirconium dioxide. In the novel method, pieces of zirconium, for example, are mixed with zirconium dioxide powder to form a charge for heating in an RF field. The pieces of zirconium, being highly susceptible are heated first causing the surrounding zirconium dioxide to heat up and form a melt. The melt is susceptible to RF energy and subsequently expands in size upon the continued input of RF energy to the charge. Since the pieces of zirconium are chemically common to the zirconium dioxide portion of the charge, no contamination occurs. The crucible-like metal container is eliminated and replaced with retaining members which are nonsusceptible to RF energy. The possibility of contamination from the elements comprising the crucible is avoided and power consumption is substantially reduced.

IN THE DRAWINGS

DESCRIPTION OF THE PREFERRED EMBODIMENT

Figure 1:
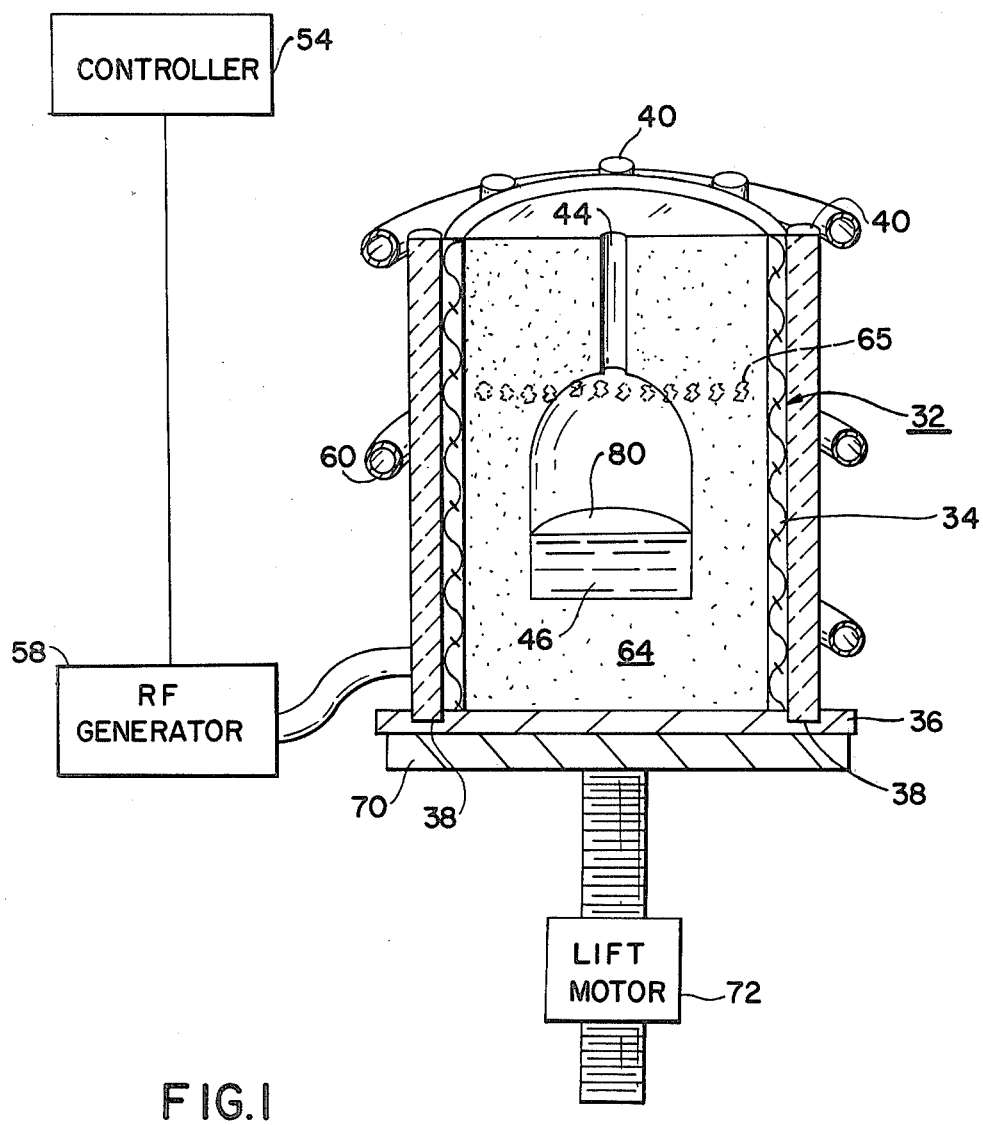
FIG. 1 is a perspective cross-sectional view of the apparatus of the invention.

Shown in FIG. 1 is an apparatus utilized in the novel method for making crystals of a substance.

Figure 2:
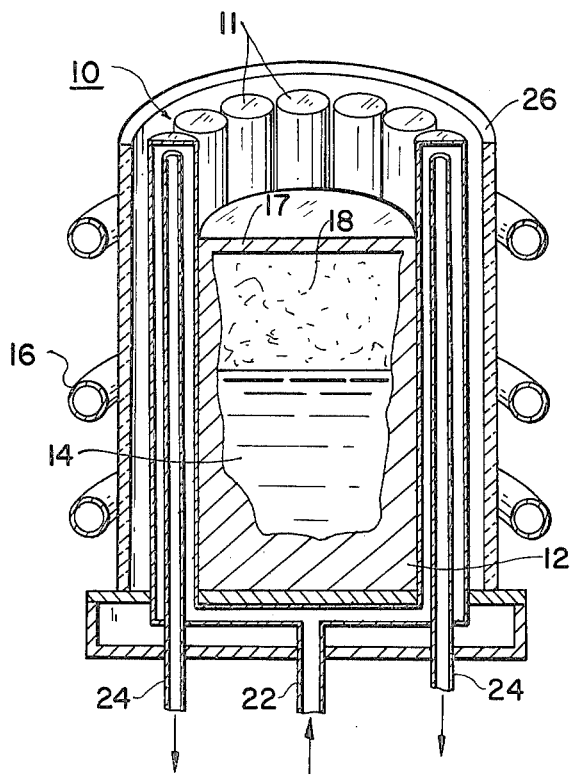
FIG. 2 is a perspective cross-sectional view of an apparatus of the prior art.

In FIG. 2, a prior art manufacturing system is shown comprising a hollow crucible 10 with water cooled fingers 11. The crucible 10 holds refractory powder reduced to a sintered shell (skull) 12 containing a melt 14 therein. The melt 14 is produced by means of a high frequency induction heating coil 16. A skin 17 without a vent is shown formed above the melt 14 trapping gases 18 thereunder.

Prior art crucibles such as crucible 10 are usually comprised of a metal, copper for example. The crucible 10 has an inlet 22 and an outlet 24 for the flow of cooling water therethrough.

The crucible 10 is shown enclosed in a protective quartz shell 26.

Crystals are produced by slowly cooling the melt over a period of time to room temperature.

The novel apparatus shown in FIG. 1 has eliminated the prior art crucible as well as the necessity for water cooling and the power consumption associated therewith. The novel apparatus utilizes a self contained charge 32 of refractory metallic powder 32, zirconium dioxide for example, which may be or not be compacted and compressed. The charge further comprises a receptable 34 made of a felt of the same substance as the charge 32, for example. The bottom of the charge 32 is supported by a base 36 consisting entirely of a refractory material such as alumina, for example. The base 36 has circular blind apertures 38 formed therein and adapted to receive an encircling plurality of retaining cylindrical refractory rods 40, of alumina, for example.

Figure 3:
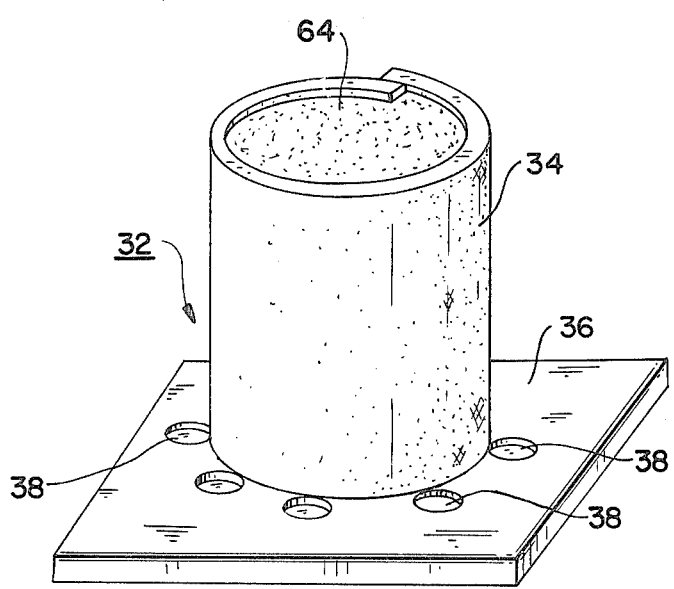
FIG. 3 is a perspective view of the novel charge arrangement of the method and apparatus shown supported by a base.

When the charge 32 is compacted to a cylindrical shape, for example, such as shown in FIG. 3, an instrument (not shown) may be placed in the center of the charge 32 during an optional packing step and withdrawn to form a vent 44.

The vent 44 serves the purpose of alleviating a build up of pressure caused by heated gases above a melt 46 as it is formed in the interior of the charge 32.

The water cooled crucible is eliminated by the heat loss from the surfaces of the charge 32. These heat losses were determined by the inventor to be sufficient to maintain the outside of the charge 32 as a solid sintered shell.

A controller 54 is provided for regulating and controlling the DC plate voltage of the oscillator tube of the RF generator. Proportionally, this provides control of the power to the RF coil 60. A measured output signal is provided which is used to control a generator 58 by means well known in the power regulation art.

The controller 54 has a preset level or a variable set-point which determines the oscillator tube plate voltage and in turn the output for RF generator 58. A measured signal from the RF generator 58 is first compared with the set-point. If the difference is such that the measured signal is less than the set point of the controller 54, the controller sends a command signal to increase the DC plate voltage of the oscillator. If the measured signal is above the set point, the controller sends a command via the oscillator plate voltage of the RF generator 58 to reduce the input power to the RF coil 60. By this process, the temperature of the melt 46 is maintained substantially constant within preset limits which correspond to the set point plus or minus a percentage factor. However, an exact temperature is not required. All that is required is that the melt be created and increased sufficiently in size to provide an adequate nucleation supply for crystal formation upon cooling.

The novel method utilizing the apparatus shown in FIG. 1 to make crystals of substances begins as shown in FIG. 3 by pouring a powder 64 of the substance into the receptacle 34 supported by the base 36 and partially filling the receptacle to a position such as indicated in Table I below by "Pos." Next, pieces 65 of metal are spread at the position and the powder 64 is again poured into the receptacle 34 until filled.

Next, the charge 32 is placed on a platform 70 which is initially positioned such that only a small portion of the top of the charge 32 extends into the radio frequency coil 60, 4.33 inches or 11 centimeters, for example, for a 12 inch or 30.5 centimeter long charge. The platform 70 is connected to a motor 72 adapted to mechanically raise the platform 70 and the charge 32 thereon into and towards the RF coil 60, thereby moving the charge 32 within the RF field, at a rate of speed independent of power input to the charge 32 from the RF coil 60. Table I below provides these parameters for a typical production run using zirconium dioxide:

TABLE I

| Day | Time | $V_p$ | $I_p$ | f | S.P. | Pos. |
|---|---|---|---|---|---|---|
| 1 | 0955 | | | 2.77 | | 7-¼ |
| | 1020 | 8.3 | | | | |
| | 1105 | 7.0 | | 2.775 | | |
| | 1125 | 4.6 | .9 | 2.777 | | |
| | 1125 | | | | | |
| | 1300 | 4.3 | 2.1 | 2.811 | | |
| | 1310 | 4.5 | 2.3 | 2.818 | 1.175 | |
| | 1325 | 4.6 | | | | |
| | 1355 | | | | | |
| | 1425 | 4.65 | 2.4 | 2.814 | 1.20 | 7 |
| | 1700 | 5.2 | 2.55 | 2.824 | 1.375 | 6-9/16 |
| 2 | 0810 | 6.95 | 3.1 | 2.837 | 1.905 | 4-⅜ |
| | 0815 | | | 2.837 | | |
| | 0915 | 7.0 | 2.95 | 2.836 | 1.913 | |
| | 0955 | 7.0 | 3.0 | 2.837 | 1.922 | |
| | 1045 | | | 2.838 | | |
| | 1135 | 7.05 | 3.05 | 2.837 | 1.93 | |
| | 1255 | 7.05 | 3.1 | 2.836 | 1.94 | 3-⅜ |
| | | 6.9 | | | 1.90 | |
| 3 | 0810 | 6.3 | 3.05 | 2.821 | 1.695 | |
| | 1625 | 5.5 | 2.7 | 2.806 | | |
| 4 | 0810 | 2.95 | | | .72 | |

In the above table $V_p$ is the plate voltage of the RF generator oscillator tube. $I_p$ is the plate current. "f" is the frequency of operation in mHz. "S.P." is an empirical number and represents the set point on the controller 54, such as an ELECTROMAX controller manufactured by Leeds and Northrup. "Pos." is the position of the charge relative to the coils. It is expressed as the distance between the bottom of the last turn of the coil 60 and the bottom of the charge 32 or top of the base 36.

The coil 60 for the run comprised three turns of ⅜" copper refrigerator tubing having an 8.75 inch inner diameter and a separation of 2.5 inches.

The charge 32 used was 5.5 inches in diameter with a height of 12 inches. Yttrium oxide ($Y_2O_3$) in the amount of 15% of the weight-percent of the charge was placed in the zirconium dioxide powder in order to stabilize it during the melt and crystallization steps. The distance from the bottom of the zirconium metal 65 to the top of the container 34 was 4 inches. The zirconium 65 was spread in the zirconium dioxide 64 over a 1.5 inch diameter. The remainder of the container 34 was completely filled with zirconium dioxide powder and yttrium oxide powder.

With the process variables as defined in Table I, one may recreate the process utilizing the apparatus described without the need of a water cooled crucible such as described herein for the prior art.

For the example specified in the table, the charge weight is about 3 kilograms and is lifted at the rate of 0.15 inches per hour.

The operating RF generator frequency used in the novel process is between 2.5 and 5 megahertz. This frequency range has been found to be useful for a cylindrical charge having a diameter from 7.5 to 15 centimeters.

The receptacle 34 used for a zirconium oxide charge is a felt sold under the trademark ZIRCAR. Typically, the felt is 0.254 centimeters thick. It is known in the industry as high purity ZYF-100.

A six inch diameter six kilogram charge 32 requires about eight one quarter inch diameter aluminum oxide rods 40 for retaining the felt receptacle 34 enclosing the charge 32.

To heat and process this six kilogram charge requires a maximum of approximately 25 kilowatts of power.

Typically, the base is comprised of insulating brick rated to 3000° F. The RF coil 60 may be excited by a 100-kilowatt generator, for example. The RF coil has a 10-inch diameter and is comprised of three turns of ½ inch outer diameter copper refrigerator tubing, for example.

A controller 54 for use as part of the apparatus described herein has a forward (or direct) acting output which decreases as deviation from the set point increases. It is self-equipped with a feedback loop and standard power supplies and is calibrated for use with a low level EMF input circuit.

The feedback loop provides a means for decreasing power to the RF field when a measured signal from the RF generator 58 is above the set point of the controller. The controller also provides the means for increasing the power to the RF field of the coil 60 when the measured signal is below the set point.

The calibrated range for the controller 54 is 35.0 to 65.0 mV. This is defined as the range over which the setter reading is within plus or minus one percent of actual reading in terms of setter span. The total range is 0 to 100 mV. The controller has a remote/local setter switch and an integral manual station. Narrow proportional action ranges from 0 to 200. Reset action is from 5 to 50 repeats per second. The RF generator 58 may be a unit such as manufactured by Lepel which includes therein the voltage regulator 58.

Other embodiments of the invention described above will be appreciated by those skilled in this art and the inventor does not therefore desire to be limited by the specification. These specifications and the examples given are provided merely to exemplify the preferred embodiment of the invention known at the time of this application.

I claim:

1. A method, which avoids the use of a liquid-cooled crucible, for making single crystals from a metallic oxide which has a high electrical conductivity at high temperatures, comprising the steps of:
   (a) selecting a base which is nonsusceptible to RF energy;
   (b) placing a plurality of spaced apart elongated members which are nonsusceptible to RF energy upon said base to form a peripheral outline of a container incorporating said base;
   (c) lining the peripheral outline formed by said elongated spaced apart members with a felt of said metallic oxide to form a porous container;
   (d) pouring said metallic oxide in said pourous container to form a nonrigid mass;
   (e) forming in said nonrigid mass a vent for venting the interior thereof;
   (f) positioning said nonrigid mass retained in said porous container in an RF field having a power input;
   (g) heating by RF field said nonrigid mass to form a melt in the interior thereof while the interface between said melt and said nonrigid mass forms a shell;
   (h) moving at least a portion of said mass within and relative to the RF field;
   (i) maintaining the power input to said RF field within a predetermined range over a first preselected period of time to retain and expand said melt while retaining the outer peripheral surface of said porous container and said nonrigid mass adjacent to said felt which forms said container below the melting point of said mass by heat loss from said peripheral surface to prevent said shell from reaching said peripheral surface;
   (j) reducing power to said RF field to zero over a second, subsequent, preselected period of time; whereby said melt within said nonrigid mass is cooled by heat loss from said peripheral surface to form said single crystals.

2. A method according to claim 1 further comprising the steps of:
   measuring the power input to a source for said RF field;
   providing a measured electrical signal for said power input measurement;
   comparing said measured signal to a set point electrical signal;
   increasing power to said source when said measured signal is less than said set point signal;
   decreasing the power to said source when said measured signal is more than said set point signal; and
   sustaining the power to said source when said measured signal is equal to the set point signal.

3. A method according to claim 1 wherein the step of forming said vent in said mass for venting the interior of said mass further comprises packing said nonrigid mass around at least a portion of a rigid object and withdrawing said object, whereby a vent leading to the interior of said mass is formed.

4. A method according to claim 1 wherein said metallic oxide comprises zirconium dioxide stabilized with yttrium oxide.

5. A method according to claim 5 wherein yttrium oxide is about 15% of said mass by weight.

6. A method according to claim 1 additionally comprising the step of:
   adding a metal of said metallic oxide to said nonrigid mass as said mass is poured into said porous container at a predetermined position to aid the formation of a melt in said RF field and to select the position of said melt in said nonrigid mass.

7. An apparatus, which avoids the use of a crucible, for making single crystals of a substance comprising means, having a power source, for producing an RF energy field, a mass of said substance having a hole therein leading to the interior of said mass, felt means consisting entirely of said substance for retaining said mass in a porous container, base means consisting entirely of material which is nonsusceptible to RF energy, elongated and spaced apart support means mounted on said base means consisting entirely of material which is nonsusceptible to RF energy for supporting said felt means and said mass, means for moving said mass within and relative to said RF field, and means for controlling power transmitted to said mass from said RF field wherein the interior of said mass is heated and transformed into a melt, the size of which is increased as the mass is moved within and relative to the RF field, while the surface of said porous container and the mass therein is cooled solely by heat loss from said surface.

8. An apparatus according to claim 7 wherein said means for producing an RF energy field is an RF coil of a size sufficient to receive said mass and porous container.

9. An apparatus according to claim 8 wherein said means for controlling power transmitted to said mass from said RF field additionally comprise means for providing a measured electrical signal for the power source to said RF coil, means for comparing said measured signal with a set point signal and a feedback loop comprising means for decreasing the power to said RF field when said measured signal is above said set point signal and means for increasing the power to said RF field when said measured signal is below said set-point signal.

10. An apparatus according to claim 7 wherein said elongated and spaced apart support means are eight (8) solid aluminum oxide rods circumferentially and equally spaced on said base also of aluminum oxide.

* * * * *